United States Patent
Ishihara

[11] Patent Number: 5,978,404
[45] Date of Patent: Nov. 2, 1999

[54] LASER BEAM EMISSION APPARATUS

[75] Inventor: Hisahiro Ishihara, Nagano, Japan

[73] Assignee: Sankyo Seiki Mfg. Co., Ltd., Nagano-ken, Japan

[21] Appl. No.: 08/972,609

[22] Filed: Nov. 18, 1997

[30] Foreign Application Priority Data

Nov. 19, 1996  [JP]  Japan .................................. 8-307796
Nov. 19, 1996  [JP]  Japan .................................. 8-307796

[51] Int. Cl.⁶ ............................................. H01S 3/19
[52] U.S. Cl. ................................ 372/50; 372/75; 372/43; 369/112; 350/394
[58] Field of Search ................................ 372/50, 75, 43; 369/112; 350/394

[56] References Cited

U.S. PATENT DOCUMENTS 4,634,232  1/1987  Tateoka .................................. 350/394
5,598,394  1/1997  Hibino et al. ........................... 369/112

FOREIGN PATENT DOCUMENTS 8-55363  2/1996  WIPO .

*Primary Examiner*—Rodney Bovernick
*Assistant Examiner*—Sung T. Kim
*Attorney, Agent, or Firm*—McAulay Nissen Goldberg Kiel & Hand, LLP

[57] ABSTRACT

A laser beam emission apparatus that may be used as a universal optical pickup laser light source. The apparatus may be used in various applications including recording/reproduction of data to/from various types of optical disks in various recording/reproducing modes. The apparatus includes a first semiconductor laser chip that emits a first laser beam at a first wavelength, and a second semiconductor laser chip that emits a second laser beam at a second wavelength different from the first wavelength. The emitted second laser beam has a plane of polarization that is perpendicular to the plane of polarization of the emitted first laser beam. The apparatus further includes a polarized beam splitter that transmits one of the laser beams and reflects the other laser beam, and a semiconductor substrate that has the laser chips and the polarized beam splitter mounted thereon. The polarized beam splitter is mounted on the semiconductor substrate in a manner such that a polarized light division surface of the polarized beam splitter is perpendicular to the substrate surface of the semiconductor substrate, and the principal optical axes of the first and second laser beams intersect at a single point on the polarized light division surface and also lie in the same plane. The plane is positioned apart from the substrate surface of the semiconductor substrate, and is perpendicular to the polarized light division surface of the polarized beam splitter.

17 Claims, 4 Drawing Sheets

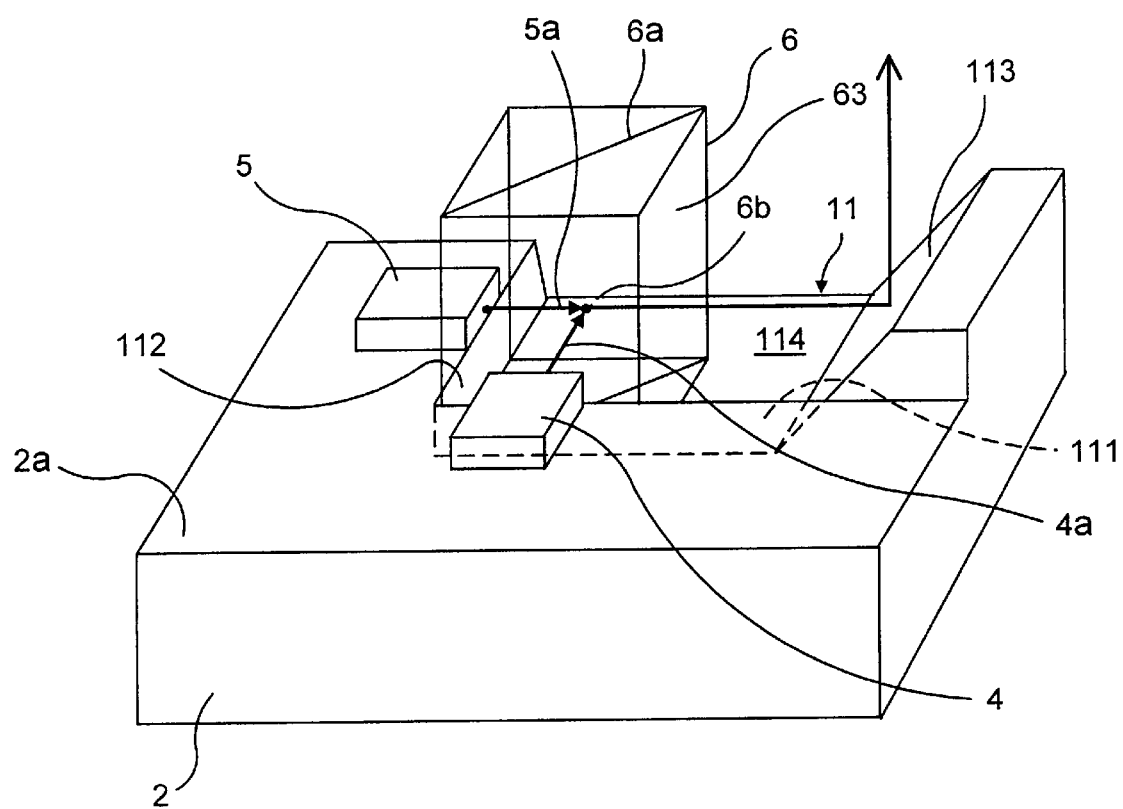
F I G. 4

LASER BEAM EMISSION APPARATUS

BACKGROUND OF THE INVENTION a) Field of the Invention

The present invention relates to a laser beam emission apparatus for use as a universal optical pickup laser light source capable of recording/playback even from optical disks recorded in different recording modes.

b) Description of the Related Art

Optical disks are now finding use not only as CDS (compact disks) but also as DVDs (digital video disks). This trend has led to studies on universal optical pickups that can be used for playback in both CD and DVD systems.

Because the recording density is much higher in DVDs than it is in CDS, a smaller-diameter light spot must be formed on the surface of the disk for playback of this high-density recorded data. In general, the diameter of the light spot formed on the disk is proportional to the wavelength of the laser beam being used. Therefore, whereas laser light sources in CD systems have a wavelength of 780 nm, DVD systems require lasers with shorter wavelengths of 635 or 650 nm. Specifically, 780-nm AlGaAs semiconductor lasers are used for CDS, and 635 or 650 nm AlGaInP semiconductor lasers are used for DVDs.

Therefore, a universal optical pickup that uses a 635 nm or 650 nm laser light source for DVD playback, should also be capable of playing-back the lower density CD recordings. In rewriteable CD-Rs, however, the 635/650 nm wavelength band is in the absorption band of the medium. Thus light in this wavelength band has extremely low reflectivity in CD-R recording media, making it unsuitable for playback of CD-R data.

This led to the development of an optical pickup capable of recording/playback of both DVD and CD-R disks, in a configuration that uses two lasers, each oscillating at a different wavelength, the appropriate laser being switch-selected according to the type of disk being used. Such a system was disclosed in Japanese Patent Kokai (laid-open application) No. 8-55363. The optical system associated with the optical pickup in this system is configured so that the laser beam from either of two semiconductor lasers mounted in different locations can be routed through a polarized wavelength filter into a common light path, thus allowing the proper semiconductor laser for the optical disk being played-back to be switch-selected. It would be very difficult, however, to miniaturize such a system.

OBJECTS OF THE INVENTION

It is therefore an object of the present invention to propose a compact laser beam emission apparatus that is suitable for use as a universal optical pickup laser light source capable of performing CD-R playback.

Various other objects, advantages and features of the present invention will become readily apparent to those of ordinary skill in the art, and the novel features will be particularly pointed out in the appended claims.

SUMMARY OF THE INVENTION

In accordance with an embodiment of the present invention, a laser beam emission apparatus is comprised of a first semiconductor laser chip that emits a first laser beam at a first wavelength, and a second semiconductor laser chip that emits a second laser beam at a second wavelength different from the first wavelength, the second laser beam having a plane of polarization that is perpendicular to the plane of polarization of the first laser beam. The apparatus further includes a polarized beam splitter that transmits one of the laser beams and reflects the other laser beam, and a semiconductor substrate that has the laser chips and the polarized beam splitter mounted thereon. The polarized beam splitter is mounted on the semiconductor substrate in a manner such that a polarized light division surface of the polarized beam splitter is perpendicular to the substrate surface of the semiconductor substrate, and the principal optical axes of the first and second laser beams intersect at a single point on the polarized light division surface and also lie in the same plane. The plane is positioned apart from the substrate surface of the semiconductor substrate. and is perpendicular to the polarized light division surface of the polarized beam splitter.

As an aspect of the present invention, the polarized beam splitter is made of a composite square-column prism, the polarized light division surface is formed from cemented mated surfaces of the composite prism, and a front surface of each laser chip faces a respective perpendicular side of the composite prism.

As another aspect of the present invention, the two laser chips are mounted on an upper surface of a submount that is mounted on the substrate surface.

As a further aspect of the present invention, the apparatus includes beam-directing means for changing the direction of the laser beam that is emitted from the polarized beam splitter.

As an additional aspect of the present invention, the two lasers operate in different modes.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts.

FIG. 4 is a simplified schematic representation of a modified version of the laser beam emission apparatus of FIG. 2.

DETAILED DESCRIPTION OF THE PREFERRED EMBODIMENTS

Figure 1:
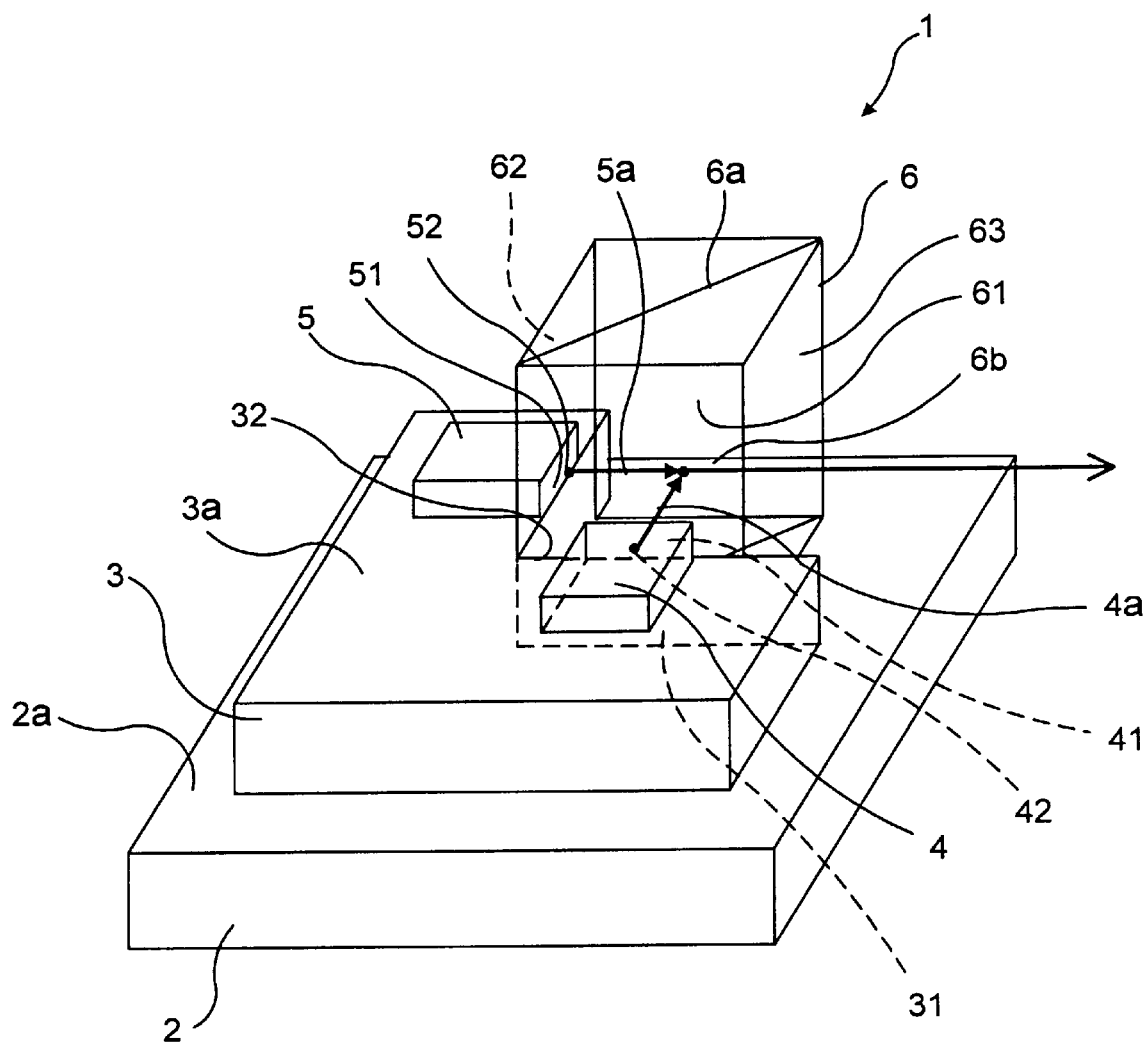
FIG. 1 is a simplified schematic representation of a laser beam emission apparatus using the present invention.

Referring now to the drawings, FIG. 1 is a simplified schematic drawing showing the main parts of a laser beam emission apparatus. As shown, the laser beam emission apparatus 1 includes a silicon substrate 2 (the semiconductor substrate); a submount 3, made of a silicon substrate, and attached in contact with the substrate surface 2a of the silicon substrate 2; first and second semiconductor laser chips 4 and 5, which are attached in contact with the surface 3a of the submount 3; and a polarized beam splitter 6, which is attached in contact with the substrate surface 2a of the silicon substrate 2.

Submount 3, which is attached in contact with the substrate surface 2a of the silicon substrate, is an L-shaped semiconductor substrate of a specific thickness. This submount 3 is made of the same material as the silicon substrate 2, so that its characteristics such as coefficient of thermal expansion, will match those of the silicon substrate 2.

The first semiconductor laser chip 4 emits a laser beam 4a, which oscillates in a TM (transverse magnetic) mode, while the second semiconductor laser chip 5 emits a laser beam 5a, which oscillates in a TE (transverse electric) mode. The planes of polarization of laser beams 4a and 5a are oriented at right angles to each other.

Polarized beam splitter 6 is made up of two prisms having the same cross-section shape: that of a right isosceles triangle. The two prisms are cemented together at their diagonal surfaces (the hypotenuse of each right isosceles triangle) to form a composite prism whose outer shape is a square column. The facing surfaces at the junction of these triangular prisms form a polarized light division surface 6a, which splits the incident light according to its direction of polarization. That is, polarized light division surface 6a is made perpendicular to the semiconductor surface 2a, so that it will reflect the TM-mode laser beam 4a, but is transparent to the TE-mode laser beam 5a. The polarized beam splitter 6 is provided so that the two perpendicular sides 61 and 62 fit tightly against the two perpendicular side surfaces 31 and 32 of the submount 3.

The first semiconductor laser chip 4 is placed above side surface 31 of submount 3, with its front surface 41 (on which emission point 42 is positioned) abutting the side surface 61 of polarized beam splitter 6. Similarly, the second semiconductor laser chip 5 is placed above side surface 32 of submount 3, with its front surface 51 (on which emission point 52 is positioned) abutting the side surface 62 of polarized beam splitter 6. The thickness of submount 3 is set such that the emission point 42 of the first semiconductor laser chip 4, and the emission point 52 of the second semiconductor laser chip 5, are positioned near the vertical midpoint (as shown in the drawing) of the polarized beam splitter 6.

The first semiconductor laser chip 4 is an AlGaInP semiconductor laser that emits a laser beam 4a oscillating in a TM mode, with a wavelength in the 635 nm band. The second semiconductor laser chip 5, on the other hand, is an AlGaAs semiconductor laser that emits a laser beam 5a oscillating in a TE mode, with a wavelength in the 780 nm band. Also, the semiconductor laser chips 4 and 5 are mounted on the surface 3a of submount 3, which is provided at a higher level higher than, and parallel to, the substrate surface 2a. Therefore, in the center of the polarized beam splitter 6, the principal optical axes of the laser beams 4a and 5a emitted from emission points 42 and 52 in the front surfaces 41 and 51 of the semiconductor laser chips 4 and 5, lie in a plane that is parallel to the substrate surface 2a. In other words, the laser beams 4a and 5a lie in the same plane, which is perpendicular to the plane of polarized light division surface 6a, which in turn, is perpendicular to substrate surface 2a. In addition, the principal optical axes of laser beams 4a and 5a are positioned such that both beams are incident to polarized light division surface 6a at a 45 angle to that surface, and intersect at a single point 6b on polarized light division surface 6a.

In a laser beam emission apparatus configured in this manner, laser beams of different wavelengths can be emitted by switching the drive applied to the two semiconductor laser chips 4 and 5. Consider, for example, the case in which laser beam emission apparatus 1 is being used as an optical pickup laser light source for DVD or CD playback. Here, for DVD playback, drive would be applied to semiconductor laser chip 4, which emits a laser beam 4a, which has a wavelength in the 635 nm band, and oscillates in a TM mode. When the emitted laser beam 4a arrives at the polarized light division surface 6a of the polarized beam-splitter 6, it is reflected at a right angle, to be emitted from the emission-side side surface 63 of polarized beam splitter 6.

Conversely, to play back a CD or CD-R disk, drive would be applied to the semiconductor laser chip 5, which emits a laser beam 5a, which has a wavelength in the 780 nm band, and oscillates in a TE mode. When the emitted laser beam 5a arrives at polarized light division surface 6a of polarized beam-splitter 6, it is transmitted through the surface, to be emitted from the same emission-side side surface 63 of polarized beam splitter 6 in the same direction as that in which the laser beam 4a was emitted. The emitted beam then passes through an objective lens (not shown in the drawing) to illuminate a spot on the surface of the disk.

In this manner, because the laser beam emission apparatus 1 of the present example is capable of emitting laser beams of different wavelengths, it is suitable for playback of both DVD and CD-R disks.

Also, as shown in the drawing, in the laser beam emission apparatus 1 of the present example, the polarized beam splitter 6 is a vertically oriented square column (a column whose horizontal cross-section is a square). In other words, in a state in which the polarized light division surface 6a is vertical (perpendicular to the silicon substrate surface 2a), and the vertical side surfaces 61 and 62 fit tightly against the front surface 41 of the semiconductor chip 4 and the front surface 51 of semiconductor chip 5, respectively, it follows that the length of the light path between the emission point 42 of the first semiconductor laser chip 4 and the point of incidence 6b of the polarized light division surface 6a of the polarized beam splitter 6, must necessarily be equal to the length of the light path between the emission point 52 of the second semiconductor laser chip 5 and the same point of incidence 6b of the polarized light division surface 6a of the polarized beam splitter 6. Accordingly, the two semiconductor laser chips 4 and 5 have a common virtual emission point. This can greatly simplify the optics, for example, when the laser beam emission apparatus 1 of the present invention is used as a laser light source for an optical pickup, in that the same light-receiving surface can be used to receive the reflected light from the optical recording medium, even though different laser beams are being used.

Thus if a polarized beam splitter 6 that has a square horizontal cross section is used, all that is required to make both light paths the same length, is to ensure that front surfaces 41 and 51 of the two semiconductor laser chips 4 and 5 fit tightly against the corresponding sides (61 and 62, respectively) of the polarized beam splitter 6. Accordingly, the use of a polarized beam splitter 6 having a square horizontal cross section provides an advantage in that it makes it very easy to set the positions of these chips.

Also if, for example, semiconductor laser chips 4 and 5 were mounted directly on the substrate surface 2a, there would be a problem in that laser beams 4a and 5a emitted from semiconductor chips 4 and 5 at the prescribed divergence angle would be reflected by substrate surface 2a, and would consequently not enter the polarized beam splitter 6 at the desired incidence angle. This would reduce the light energy of the original laser beam being output from the apparatus through polarized beam splitter 6. In the present example, however, laser chips 4 and 5 are installed on the submount 3, thus positioning the principal axes of the emitted laser beams 4a and 5a above the substrate surface 2a of the silicon substrate 2 by an amount equal to the thickness of the submount 3, thus preventing the laser beams from being eclipsed by the substrate surface 2a.

This example has an additional advantage related to the ease with which the positions of the polarized beam splitter 6 and the submount 3 can be aligned during assembly. Since in this example, the sides 31 and 32 of submount 3 are designed to fit tightly against the sides 61 and 62 of the polarized beam splitter 6, when either the polarized beam splitter or the submount is being installed (with the other component, i.e., the beam splitter or the submount, already mounted in place on the semiconductor substrate), all that is required to achieve proper alignment of both components is to place the component being installed tightly against the facing sides of the component already mounted on the substrate.

Moreover, when the laser beam emission apparatus 1 of the present example is used in an optical pickup, in addition to the semiconductor laser chips 4 and 5, a photoreceptor for receiving the light being reflected back from the optical recording medium may also be incorporated into the silicon substrate 2. In fact, this integration need not be confined to the light sources and photoreceptors. An integrated circuit for the light sources and photoreceptors could be incorporated, along with other associated electronic circuitry, within a single component. This approach can be applied similarly to the laser beam emission apparatus shown in FIGS. 2 through 4, to be described below.

Also, in the above example, the semiconductor laser chips 4 and 5 were both mounted on a common L-shaped submount. This was done to reduce the parts count and simplify the mounting process. It goes without saying however, that if these factors are not a concern, each semiconductor laser chip may be mounted on separate submounts.

In addition, instead of using a submount, a recess could be etched into the upper surface of the semiconductor substrate. The polarized beam splitter could then be mounted on the floor of this recess, and the first and second semiconductor laser chips mounted on the surface of the substrate surface (at a higher level than the floor of the recess). When this is done, the recess could be provided with two mutually perpendicular side surfaces made to fit tightly against the two corresponding mutually perpendicular sides of the composite prism, to simplify the task of positioning of the polarized beam splitter.

Figure 2:
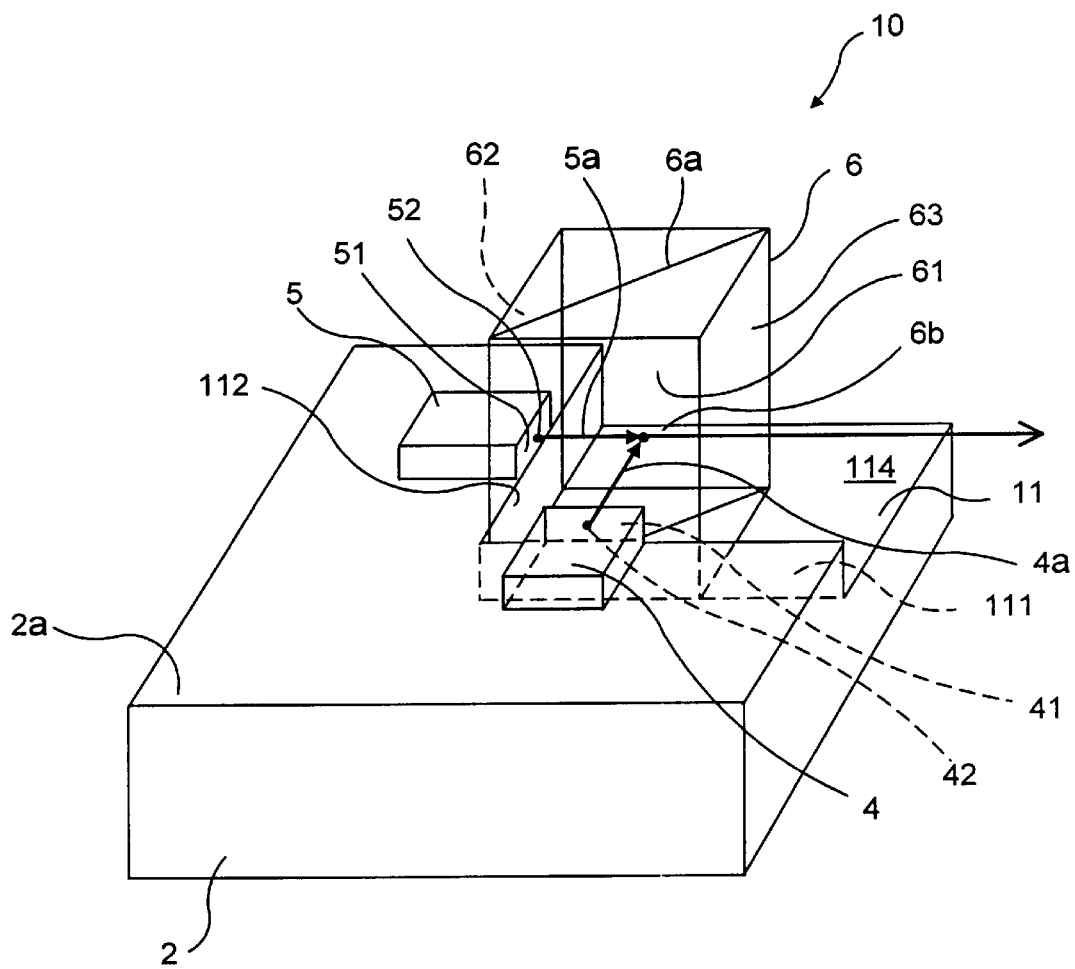
FIG. 2 is a simplified schematic representation of another embodiment of a laser beam emission apparatus using the present invention.

FIG. 2 is a simplified schematic representation showing the main parts of another embodiment of the laser beam emission apparatus, with a recess formed in the substrate surface of the semiconductor substrate in the manner described above. Because the basic configuration of the laser beam emission apparatus 10 shown in this drawing is the same as that of the laser beam emission apparatus 1 described above, corresponding parts that are also the same are assigned the same reference numbers in both drawings and will not be described here.

In the laser beam emission apparatus 10 of this example, there is no submount for mounting the two semiconductor laser chips 4 and 5. Semiconductor laser chips 4 and 5 are mounted in direct contact with the substrate surface 2a of the silicon substrate 2. Also, the recess 11, which is etched into a portion of the substrate surface 2a, is formed to a depth such that the principal optical axes of the laser beams 4a and 5a emitted from semiconductor laser chips 4 and 5 are raised above the substrate surface, preferably by an amount that puts them midway between the bottom and top of the polarized beam splitter 6 (with polarized beam splitter 6 mounted in contact with the floor 114 of the recess 11). The polarized beam splitter 6 is installed with its polarized light division surface 6a perpendicular to the floor 114 of the recess 11, which is parallel to the substrate surface 2a. The mutually perpendicular sides 61 and 62 of the polarized beam splitter 6 are placed against the two mutually perpendicular side surfaces 111 and 112 of recess 11. In all other respects, this configuration is the same as that of the laser beam emission apparatus 1 shown in FIG. 1, and will therefore not be discussed further.

A laser beam emission apparatus 10 configured in this manner operates the same as the laser beam emission apparatus 1 described earlier, to switch between the laser beams 4a and 5a, oscillating at different wavelengths, for output as the emitted laser beam. It also achieves the same operational advantages. The laser beam emission apparatus 10 of this embodiment, however, does not require a submount, which provides additional advantages in the form of reduced parts count and easy assembly.

In the above laser beam emission apparatus 1 and 10, an emitted laser beam, either 4a or 5a, emerges from an emission surface 63 of a polarized beam splitter 6 oriented in a direction parallel to the substrate surface 2a. Depending on the layout of the optics in the optical pickup unit in which the laser beam emission apparatus is assembled, however, it may be desirable to emit the laser beam in a direction that is not parallel to the substrate surface 2a. Typically this would be in a direction perpendicular to the substrate surface 2a. This can be accomplished by adding a beam-directing element to aim the laser beam emitted from polarized beam splitter 6 in the desired direction of emission.

Figure 3:
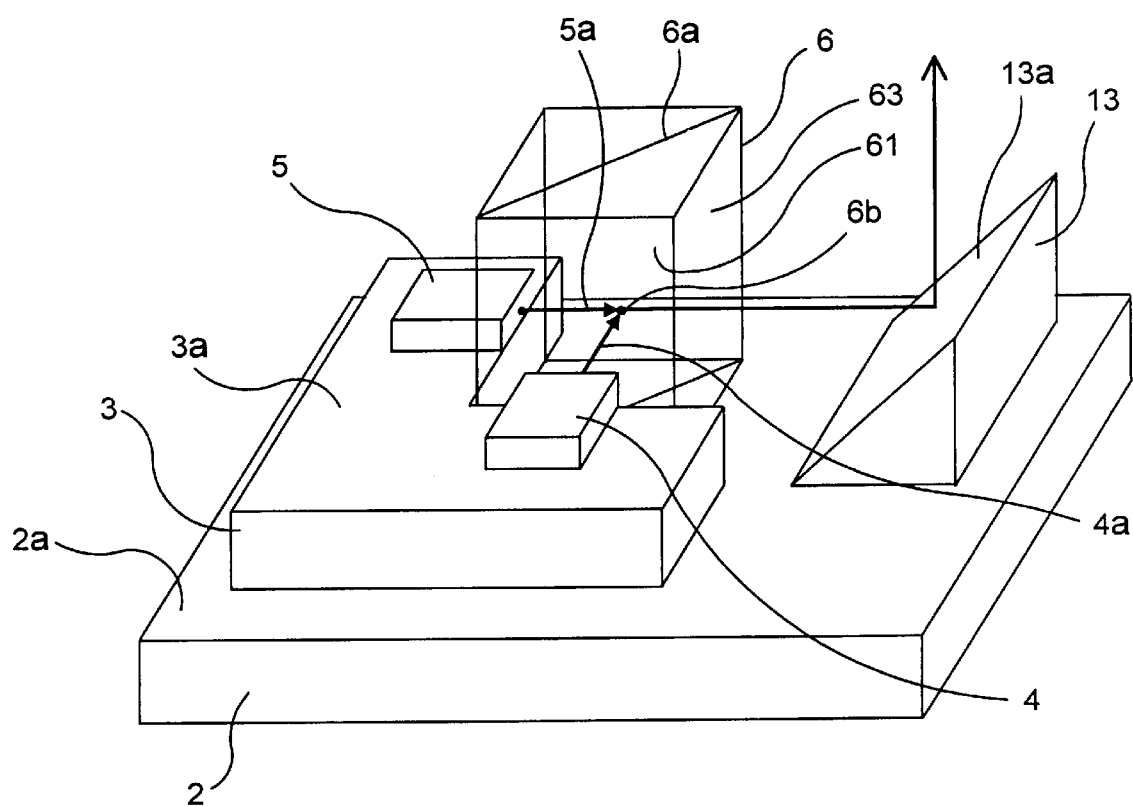
FIG. 3 is a simplified schematic representation of a modified version of the laser beam emission apparatus of FIG. 1.

In the laser emission apparatus 1 of FIG. 1, for example, the fully reflective mirror member 13 could be attached in contact with the substrate surface 2a of the silicon substrate 2, as shown in FIG. 3. In this example, the reflective surface 13a of the fully reflective mirror member 13 faces the side surface 63 of the beam splitter 6, tilted upward at an angle of 45 degrees with respect to the substrate surface 2a. With fully reflective mirror member 13 positioned as shown here, reflective surface 13a would cause laser beams 4a and 5a to be emitted vertically (i.e., perpendicular to the substrate surface 2a). The emitted light would then pass through an objective lens to illuminate a spot on the surface of the disk, as in the prior example.

Also, in the laser beam emission apparatus 10, as shown in FIG. 2 for example, the etching of recess 11 into silicon substrate 2 might be performed, as shown in FIG. 4, for example, to provide, along with the floor 114 and the mutually perpendicular walls 111 and 112, a side surface 113, facing exit side surface 63 of polarized beam splitter 6, and tilted upward, for example, at a 45 degree angle with respect to the floor 114. With this configuration, laser beams 4a and 5a emitted from the polarized beam splitter 6 could be reflected toward the vertical direction by reflective surface 113 of the silicon substrate 2, yet in a structure simplified by the elimination of the requirement for a fully reflective mirror member.

The laser emission apparatus of the present invention is configured by standing a polarized beam splitter on end on the surface of a semiconductor substrate, and properly positioning two semiconductor laser chips in the same plane: a plane that is perpendicular to the polarized light division surface and extends vertically from the substrate surface. Through this configuration, two laser beams of different wavelengths can be selectively output by switching the drive applied to the semiconductor laser chips. Accordingly, a laser light source for emitting laser beams of different wavelengths can be realized in a configuration that is extremely simple, small, and compact.

Also, in the present invention, a polarized beam splitter made of a composite square column prism is placed standing on end, and the front surfaces of each of a first and second semiconductor laser chip are mounted so that they fit tightly against the two perpendicular sides of this composite prism (one laser chip against each side). This configuration simplifies the task of properly aligning the positions of the two semiconductor laser chips relative to the polarized light division surface of the beam splitter.

Also, in the present invention, the length of the light path between the first semiconductor laser chip and the polarized light division surface of the polarized beam splitter is set equal to the length of the light path between the second semiconductor laser chip and the polarized light division surface of the polarized beam splitter, which causes the two semiconductor laser chips to have a common virtual emission point. This provides an advantage in that when the laser beam emission apparatus is used in an optical pickup, the light receiving surface for receiving light reflected from the optical disk can also be made common to the laser beams from both semiconductor lasers, thus simplifying the optical pickup configuration.

While the foregoing description and drawings represent the preferred embodiments of the present invention, it will be readily appreciated by those of ordinary skill in the art that various changes may be made without departing from the spirit and scope of the invention. Therefore, it is intended that the appended claims be interpreted as including the embodiments described herein, the alternatives mentioned above, and all equivalents thereto.

What is claimed is:

1. A laser beam emission apparatus, comprising:
   a first semiconductor laser chip for emitting a first laser beam from a front surface thereof;
   a second semiconductor laser chip for emitting a second laser beam from a front surface thereof, said second laser beam having a wavelength different from a wavelength of said first laser beam, said second laser beam having a plane of polarization perpendicular to a plane of polarization of said first laser beam;
   a polarized beam splitter for transmitting one of said first and second laser beams, and for reflecting the other of said first and second laser beams, said front surface of said first semiconductor laser chip abutting a first side surface of said polarized beam splitter, said front surface of said second semiconductor laser chip abutting a second side surface of said polarized beam splitter; and
   a semiconductor substrate having said first and second semiconductor laser chips and said polarized beam splitter mounted thereon, said polarized beam splitter being mounted on said semiconductor substrate in a manner such that a polarized light division surface of said polarized beam splitter is perpendicular to a substrate surface of said semiconductor substrate, and principal optical axes of said first and second laser beams emitted from said first and second semiconductor laser chips, respectively, intersect at a single point on said polarized light division surface and lie in the same plane, said plane being positioned apart from the substrate surface of said semiconductor substrate on which said polarized beam splitter is mounted and perpendicular to the polarized light division surface of said polarized beam splitter.

2. The laser beam emission apparatus of claim 1, wherein said polarized beam splitter is made of a composite square-column prism; said polarized light division surface is formed from cemented mated surfaces of said composite prism; and a front surface of each of said first and second semiconductor laser chips faces respective perpendicular sides of said composite prism.

3. The laser beam emission apparatus of claim 2, further comprising a submount mounted on said substrate surface; and wherein said polarized beam splitter is mounted on said substrate surface of said semiconductor substrate; and said first and second semiconductor laser chips are mounted on an upper surface of said submount.

4. The laser beam emission apparatus of claim 3, wherein said submount comprises two perpendicular side surfaces, said side surfaces being disposed adjacent and in direct contact with respective perpendicular sides of said composite prism.

5. The laser beam emission apparatus of claim 4, further comprising beam-directing means for changing the direction of a laser beam emitted from said polarized beam splitter.

6. The laser beam emission apparatus of claim 5, wherein said beam-directing means is a reflecting mirror mounted on said semiconductor substrate.

7. The laser beam emission apparatus of claim 4, wherein a length of an optical light path between said first semiconductor laser chip and said polarized light division surface of said polarized beam splitter is substantially equal to a length of an optical light path between said second semiconductor laser chip and said polarized light division surface.

8. The laser beam emission apparatus of claim 2, wherein said polarized beam splitter is mounted on a floor of a recess etched into said substrate surface of said semiconductor substrate; and said first and second semiconductor laser chips are mounted on said substrate surface.

9. The laser beam emission apparatus of claim 8, wherein said recess includes two perpendicular side surfaces; and said two perpendicular sides of said composite prism fitting against the respective perpendicular side surfaces of said recess.

10. The laser beam emission apparatus of claim 9, further comprising a beam-directing means for changing a direction of a laser beam emitted from said polarized beam splitter.

11. The laser beam emission apparatus of claim 10, wherein said beam-directing means is a reflective surface formed in said substrate surface of said semiconductor substrate.

12. The laser beam emission apparatus of claim 1, wherein a length of an optical light path between said first semiconductor laser chip and said polarized light division surface of said polarized beam splitter is substantially equal to a length of an optical light path between said second semiconductor laser chip and said polarized light division surface.

13. The laser beam emission apparatus of claim 12, wherein one of said first and second semiconductor laser chips is an AlGaInP semiconductor laser oscillating in a TM mode in the 635 nm wavelength band.

14. The laser beam emission apparatus of claim 12, wherein one of said first and second semiconductor laser chips is an AlGaAs semiconductor laser oscillating in a TE mode in the 780 nm wavelength band.

15. The laser beam emission apparatus of claim 14, wherein the other of said first and second semiconductor laser chips is an AlGaInP semiconductor laser oscillating in a TM mode in the 635 nm wavelength band.

16. The laser beam emission apparatus of claim 1, wherein one of said first and second semiconductor laser chips operates in a first mode; and the other of said first and second semiconductor laser chips operates in a second mode, said first and second modes being different.

17. The laser beam emission apparatus of claim 16, wherein said first mode is a TE mode; and said second mode is a TM mode.

* * * * *